United States Patent
Hammer et al.

(10) Patent No.: US 7,551,433 B2
(45) Date of Patent: Jun. 23, 2009

(54) METHOD AND APPARATUS FOR MOUNTING A COMPONENT IN A CHASSIS

(75) Inventors: Shawn Hammer, Round Rock, TX (US); Larry Kosch, Leander, TX (US)

(73) Assignee: Dell Products L.P., Round Rock, TX (US)

(*) Notice: Subject to any disclaimer, the term of this patent is extended or adjusted under 35 U.S.C. 154(b) by 349 days.

(21) Appl. No.: 11/259,444

(22) Filed: Oct. 26, 2005

(65) Prior Publication Data

US 2007/0091549 A1    Apr. 26, 2007

(51) Int. Cl.
*H05K 5/00* (2006.01)
*H05K 7/14* (2006.01)

(52) U.S. Cl. .................................... 361/685

(58) Field of Classification Search ......... 361/679–689, 361/727, 728, 730, 752, 789, 807; 248/201, 248/560–636, 638; 414/280; 360/97.01–100.1; 369/75.11, 77.21; 29/700, 729; 312/223.1–223.2, 312/332.1–333; 710/302
See application file for complete search history.

(56) References Cited

U.S. PATENT DOCUMENTS

| | | | | |
|---|---|---|---|---|
| 4,495,546 A * | 1/1985 | Nakamura et al. | ........... | 361/749 |
| 5,227,954 A * | 7/1993 | Twigg | ......................... | 361/685 |
| 5,446,240 A * | 8/1995 | Hayakawa et al. | ............. | 174/69 |
| 5,652,695 A | 7/1997 | Schmitt | | |
| 5,917,149 A * | 6/1999 | Barcley et al. | ............... | 174/378 |
| 5,921,644 A * | 7/1999 | Brunel et al. | ............. | 312/223.2 |
| 6,122,165 A * | 9/2000 | Schmitt et al. | ............... | 361/685 |
| 6,142,593 A | 11/2000 | Kim et al. | | |
| 6,166,901 A | 12/2000 | Gamble et al. | | |
| 6,229,709 B1 * | 5/2001 | Hardt et al. | ................. | 361/753 |
| 6,320,128 B1 * | 11/2001 | Glovatsky et al. | ........... | 174/548 |
| 6,442,021 B1 | 8/2002 | Bolognia et al. | | |
| 6,560,098 B1 | 5/2003 | Beinor, Jr. et al. | | |
| 6,637,719 B2 | 10/2003 | Jiang | | |
| 6,700,074 B2 * | 3/2004 | Michel et al. | ............... | 174/260 |
| 6,819,555 B2 | 11/2004 | Bolognia et al. | | |
| 6,876,547 B2 | 4/2005 | McAlister | | |
| 7,016,190 B1 * | 3/2006 | Chang | ........................ | 361/685 |
| 7,075,796 B1 * | 7/2006 | Pritchett | ..................... | 361/796 |
| 7,149,190 B1 * | 12/2006 | Li et al. | ...................... | 370/278 |
| 7,321,489 B2 * | 1/2008 | McAlister | ................... | 361/685 |
| 7,350,884 B2 * | 4/2008 | Palker et al. | ............. | 312/334.1 |
| 2002/0101713 A1 * | 8/2002 | Eland | .......................... | 361/686 |
| 2005/0077334 A1 | 4/2005 | Craig, Jr. | | |
| 2005/0112910 A1 * | 5/2005 | Randall et al. | ................ | 439/62 |
| 2006/0114661 A1 * | 6/2006 | Haba | .......................... | 361/749 |

OTHER PUBLICATIONS

Search and Examination Report issued by Intellectual Property Office of Singapore, Singapore Application No. 200607345-6, Nov. 16, 2007.

* cited by examiner

*Primary Examiner*—Paresh Patel
(74) *Attorney, Agent, or Firm*—Haynes and Boone, LLP

(57) ABSTRACT

A component mounting apparatus includes a support surface. A fixed wall extends from the support surface. A floating wall is coupled to the support surface by a plurality of resilient arms extending between the support surface and the floating wall. A component may be positioned on the support surface between the fixed wall and the floating wall, whereby the plurality of resilient arms adjust the position of the floating wall to allow the component to be easy secured to or removed from the component mounting apparatus.

19 Claims, 12 Drawing Sheets

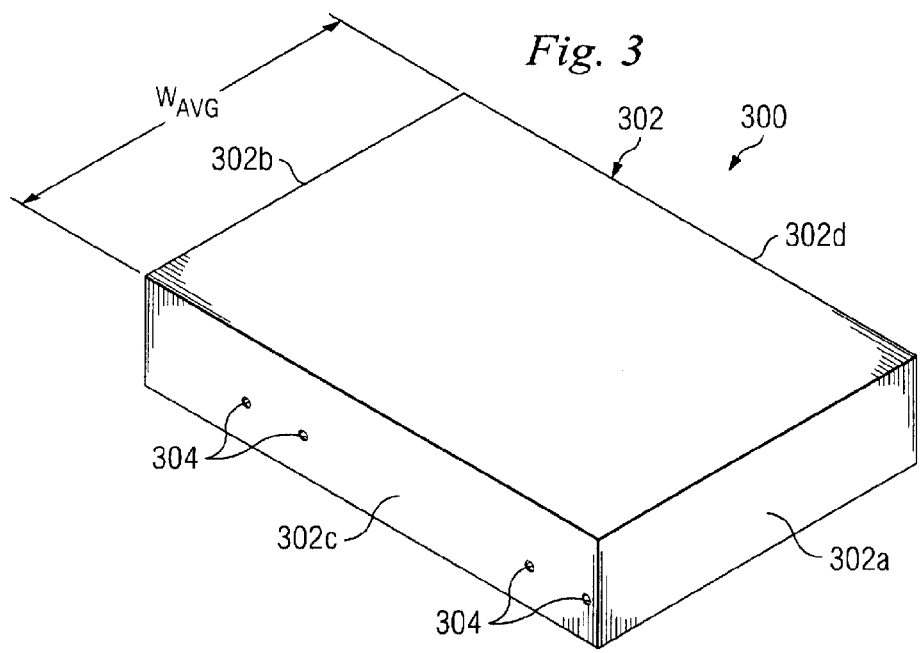
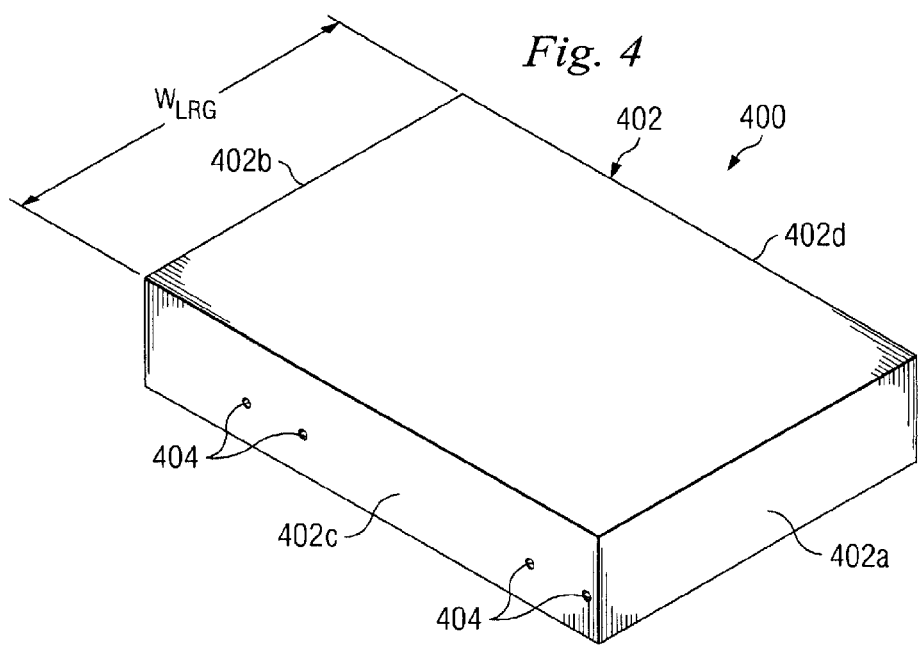

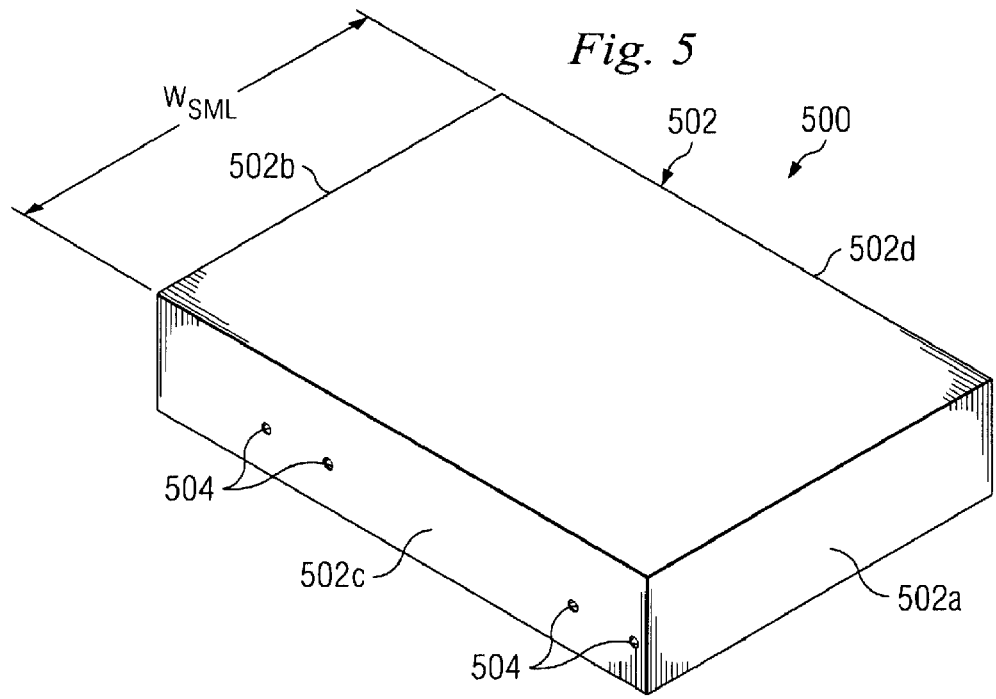
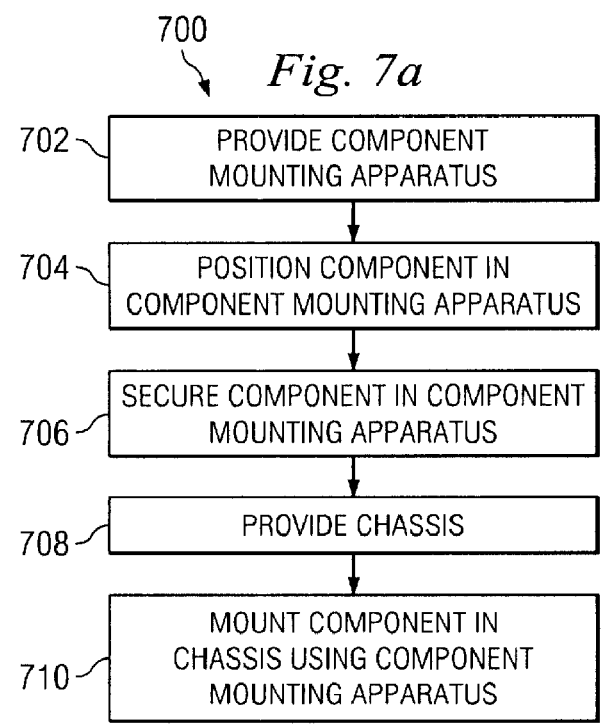

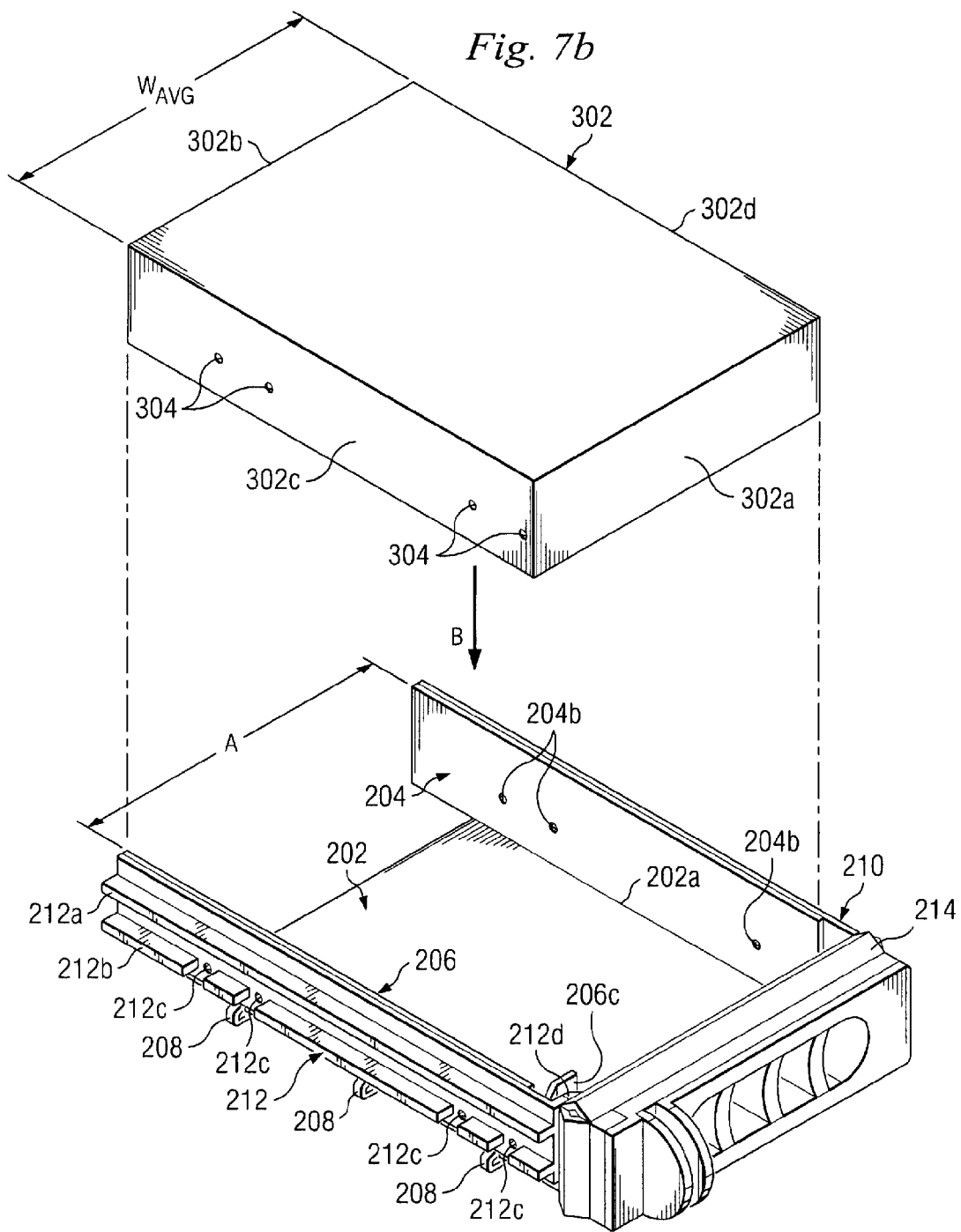

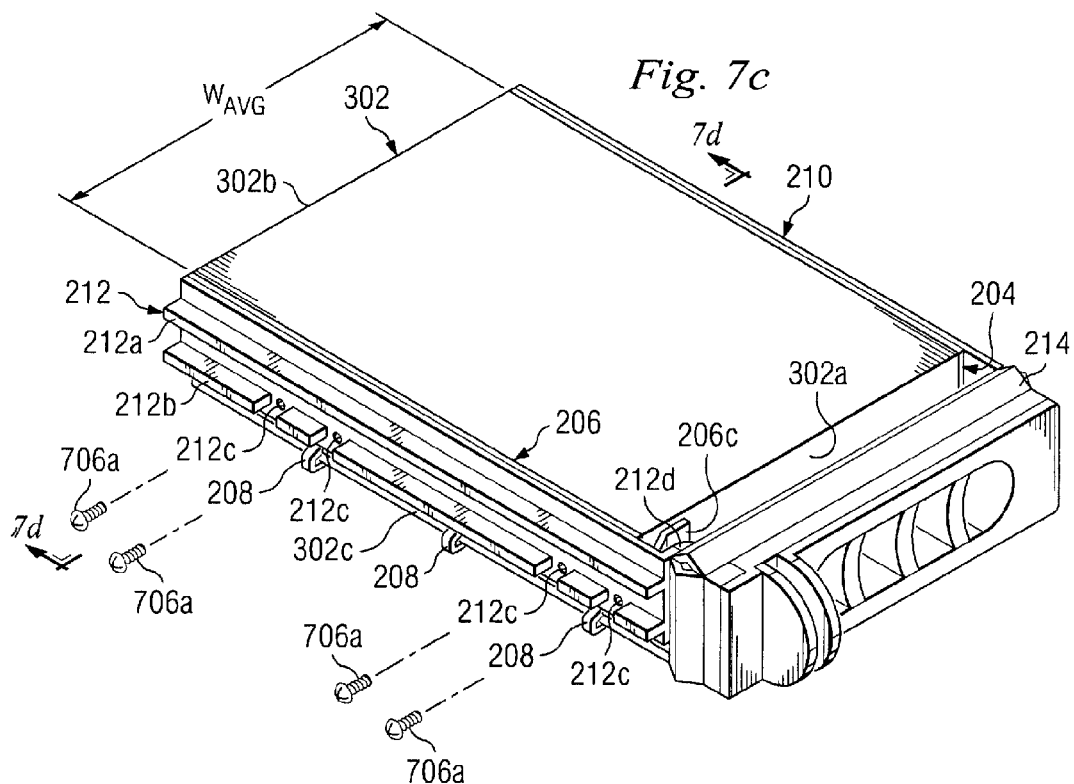
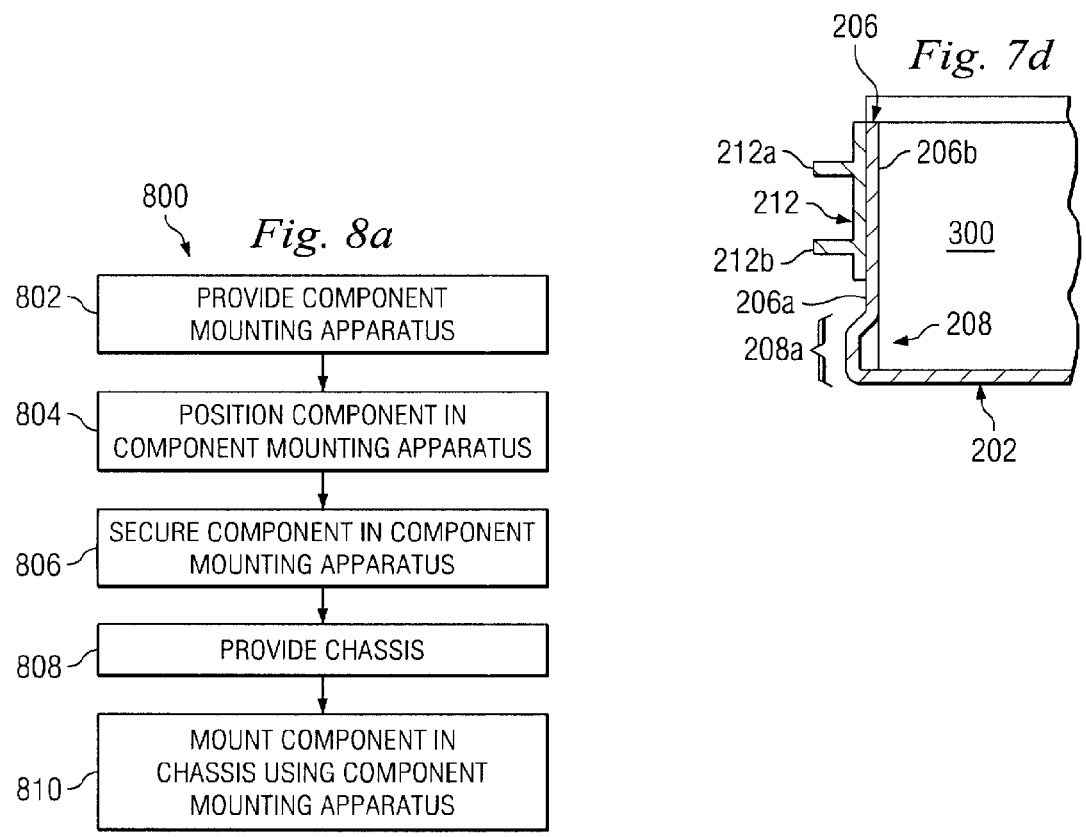

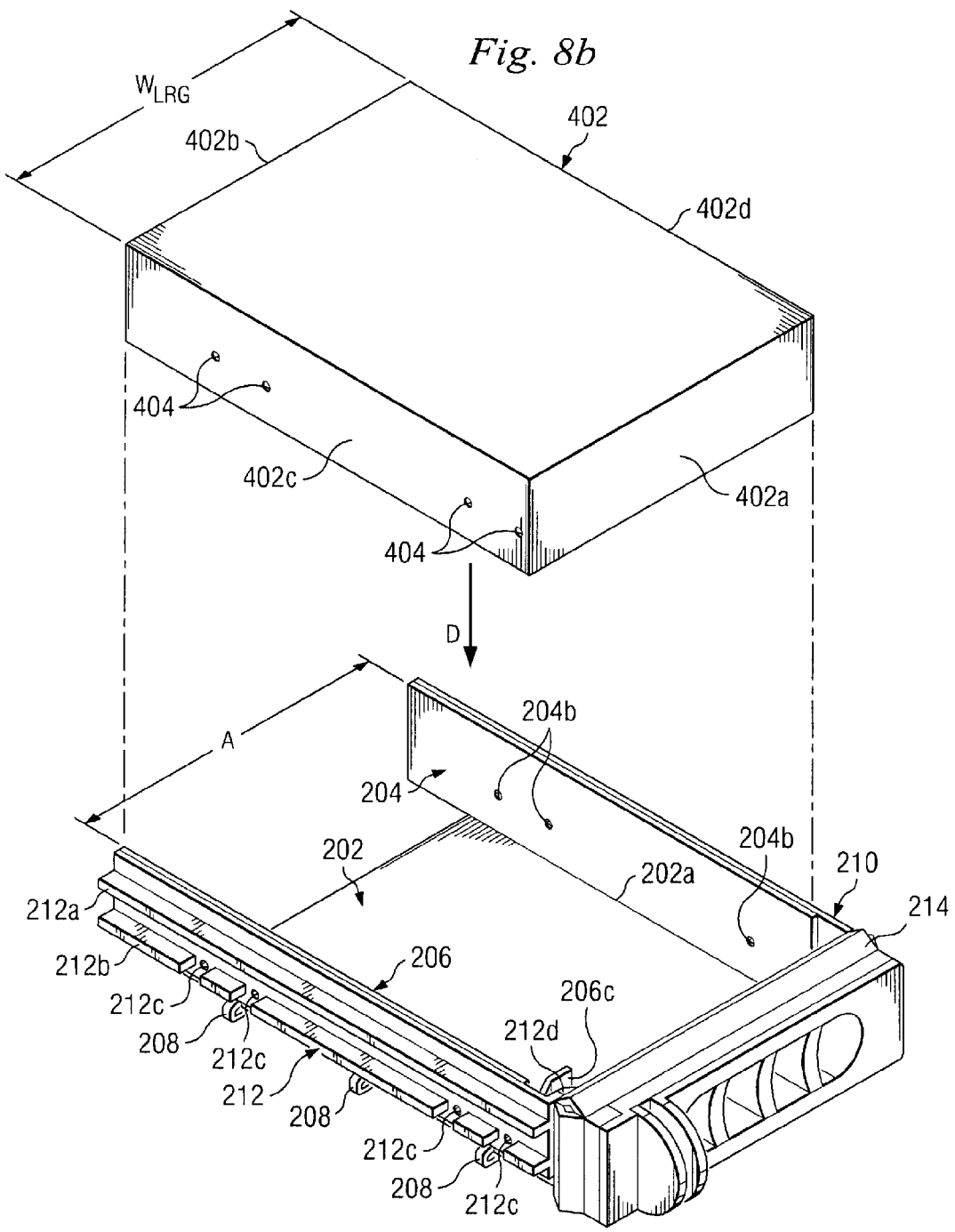

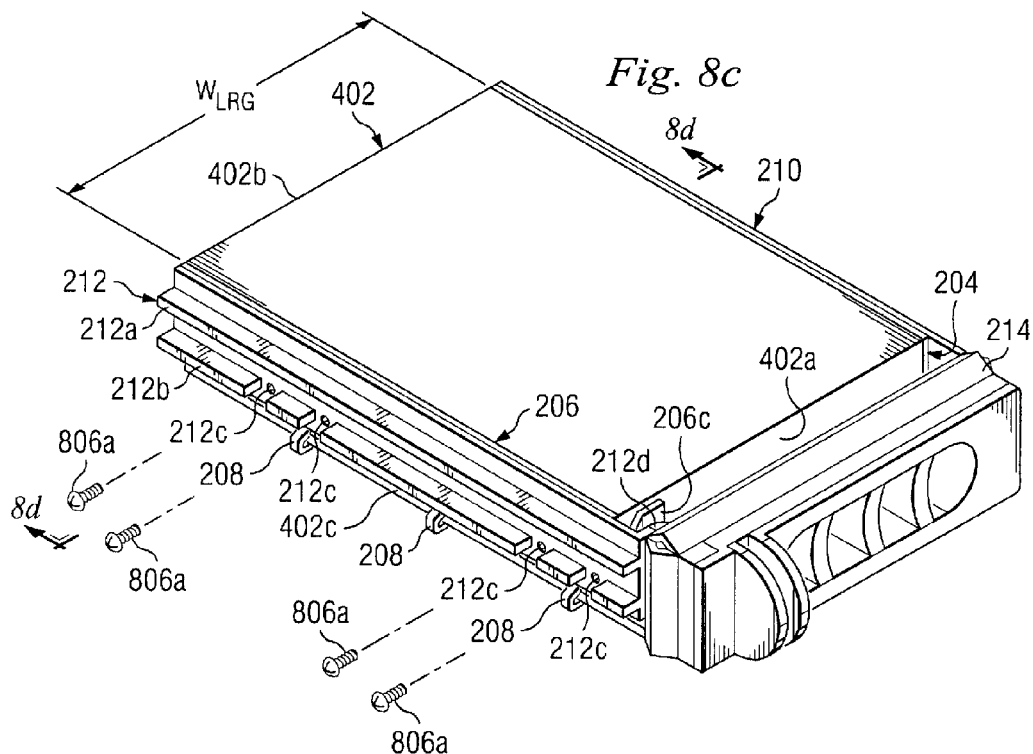
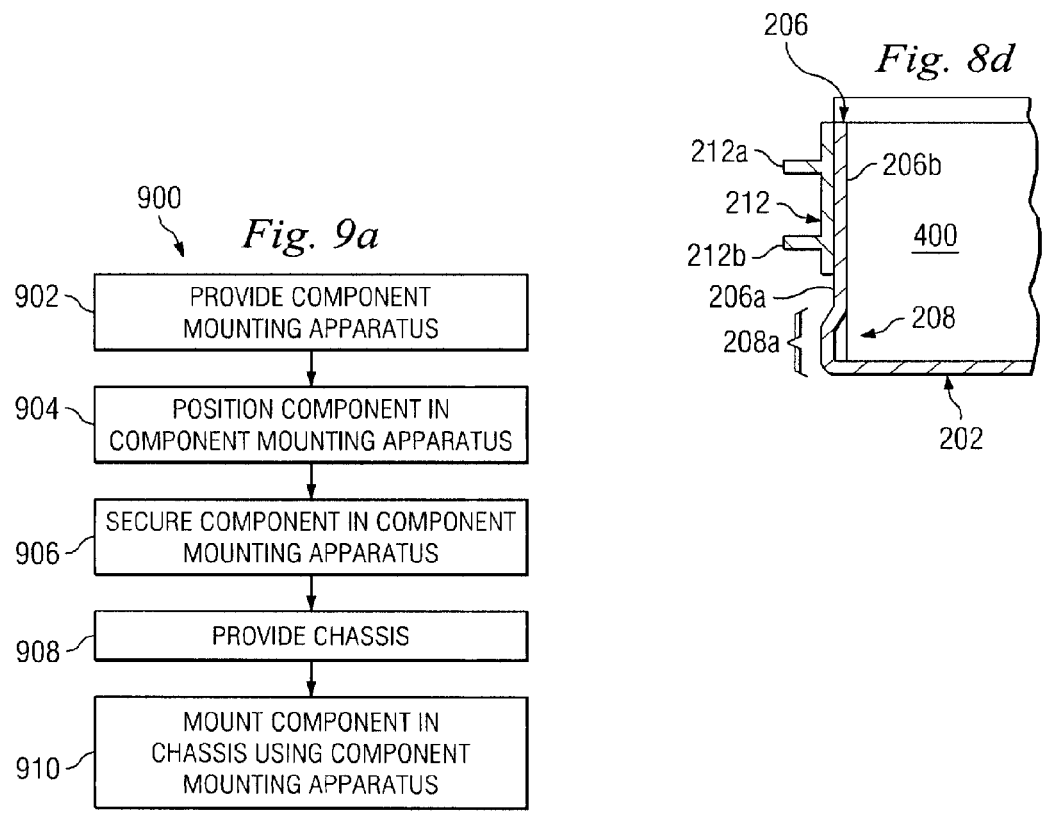

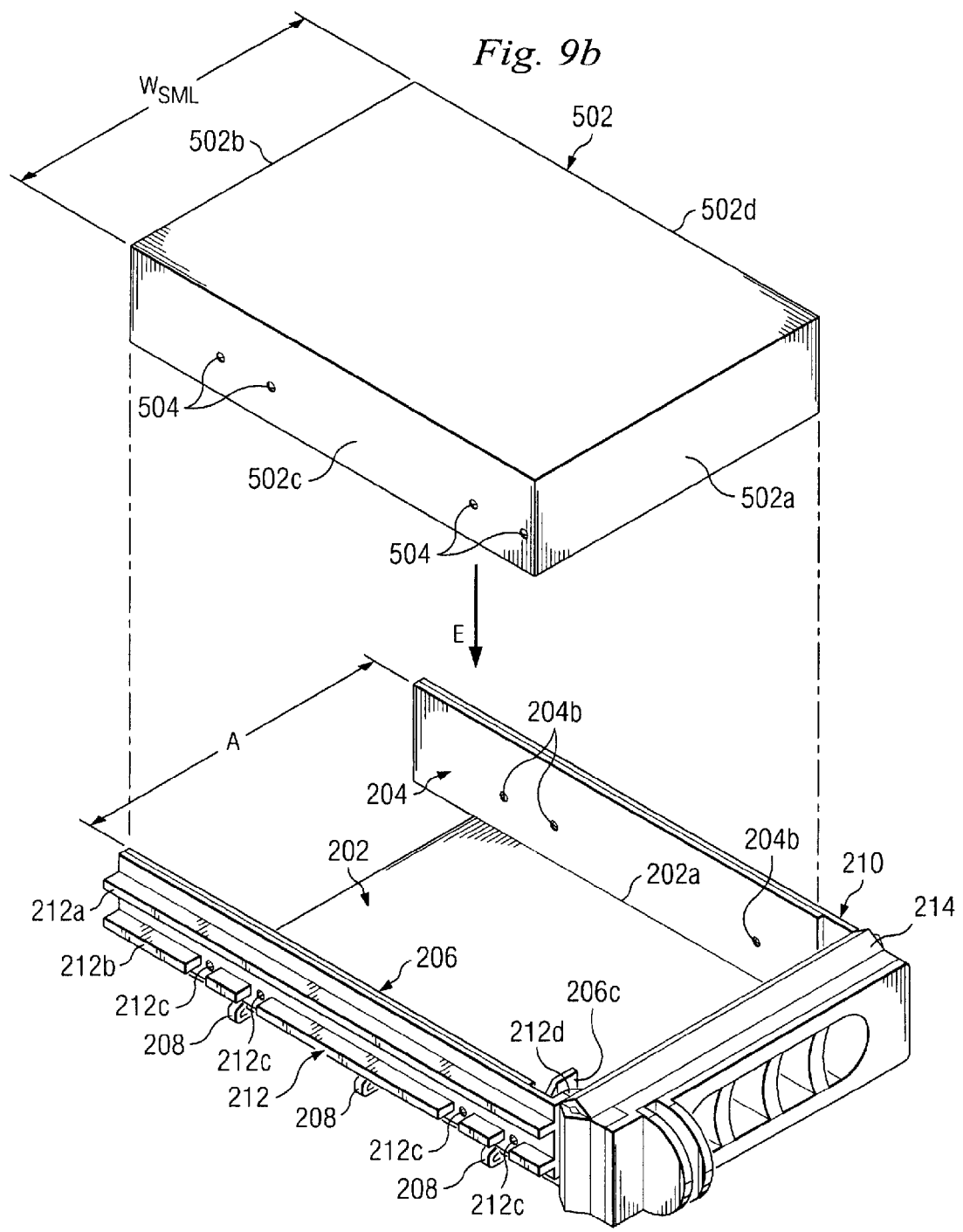

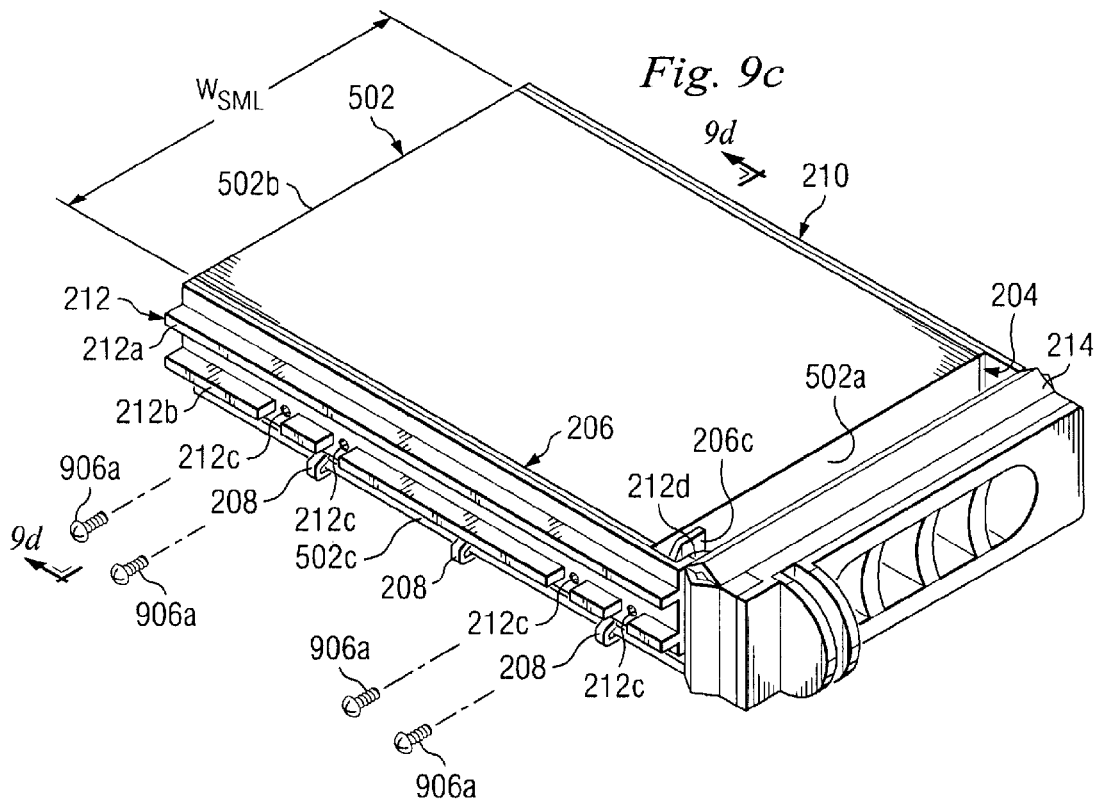
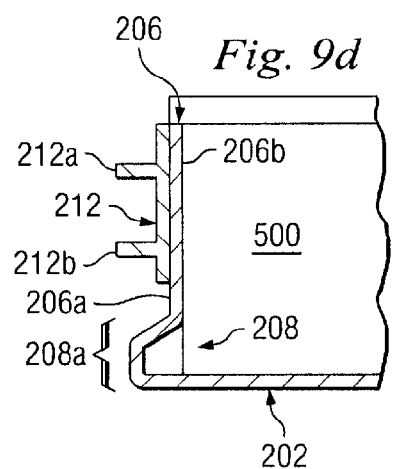

METHOD AND APPARATUS FOR MOUNTING A COMPONENT IN A CHASSIS

BACKGROUND

The present disclosure relates generally to information handling systems, and more particularly to mounting a component in an information handling system chassis.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As constraints on cost and space increase in information handling systems, the need for standardized, simplified mounting mechanisms for information handling system components increases as well. Mounting trays or brackets must accommodate dimensional variations in components due to mechanical manufacturing tolerances, while providing structural support and protection.

Typically, in order to support and protect components, three-sided carrier enclosures are utilized which include a support surface and a pair of spaced apart side walls between which the component is positioned on the support surface. An ongoing challenge exists to structurally support the component with the support surface while enabling adequate width variability between the side walls, as carrier designs without width variability can raise issues with respect to the mounting and removal of components to and from the carrier. For example, when a smaller than average sized component is secured in a conventional carrier, the securing of the side walls to the component can cause the support surface to bow away from the component and take up additional volume in the information handling system chassis which may be needed for other components. Furthermore, when a larger than average sized component is positioned in a conventional carrier, the component can cause the side walls to bow out, making the side walls difficult to secure to the component and resulting in the component becoming stuck in the carrier.

Conventional solutions typically attempt to adjust the carrier to the size of the component, but tend to either be sized very large, taking up volume in the information handling system chassis that could be used for other components, or involve complex designs which allow the sides walls to adjust, but require a large number of parts, which increases cost and failure rate.

Accordingly, it would be desirable to provide for mounting a component in a chassis absent the disadvantages discussed above.

SUMMARY

According to one embodiment, a component mounting apparatus includes a support surface, a fixed wall extending from the support surface, and a floating wall coupled to the support surface by a plurality of resilient arms extending between the support surface and the floating wall.

BRIEF DESCRIPTION OF THE DRAWINGS

FIG. 2b is a rear perspective view illustrating an embodiment of the component mounting apparatus of FIG. 2a.

FIG. 3 is a perspective view illustrating an embodiment of an average sized component used with the component mounting apparatus of FIGS. 2a, 2b, and 2c.

FIG. 4 is a perspective view illustrating an embodiment of a larger than average sized component used with the component mounting apparatus of FIGS. 2a, 2b, and 2c.

FIG. 5 is a perspective view illustrating an embodiment of a smaller than average sized component used with the component mounting apparatus of. FIGS. 2a, 2b, and 2c.

FIG. 7a is a flow chart illustrating an embodiment of a method for mounting a component in a chassis.

FIG. 7b is a perspective view illustrating an embodiment of the average sized component of FIG. 3 being coupled to the component mounting apparatus of FIG. 2a.

FIG. 7c is a perspective view illustrating an embodiment of the average sized component of FIG. 3 being secured in the component mounting apparatus of FIG. 2a.

FIG. 7d is a cross sectional view illustrating an embodiment of the average sized component of FIG. 3 secured in the component mounting apparatus of FIG. 2a.

FIG. 8a is a flow chart illustrating an embodiment of a method for mounting a component in a chassis.

FIG. 8b is a perspective view illustrating an embodiment of the larger than average sized component of FIG. 4 being coupled to the component mounting apparatus of FIG. 2a.

FIG. 8c is a perspective view illustrating an embodiment of the larger than average sized component of FIG. 4 being secured in the component mounting apparatus of FIG. 2a.

FIG. 8d is a cross sectional view illustrating an embodiment of the larger than average sized component of FIG. 4 secured in the component mounting apparatus of FIG. 2a.

FIG. 9a is a flow chart illustrating an embodiment of a method for mounting a component in a chassis.

FIG. 9b is a perspective view illustrating an embodiment of the smaller than average sized component of FIG. 5 being coupled to the component mounting apparatus of FIG. 2a.

FIG. 9c is a perspective view illustrating an embodiment of the smaller than average sized component of FIG. 5 being secured in the component mounting apparatus of FIG. 2a.

FIG. 9d is a cross sectional view illustrating an embodiment of the smaller than average sized component of FIG. 5 secured in the component mounting apparatus of FIG. 2a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
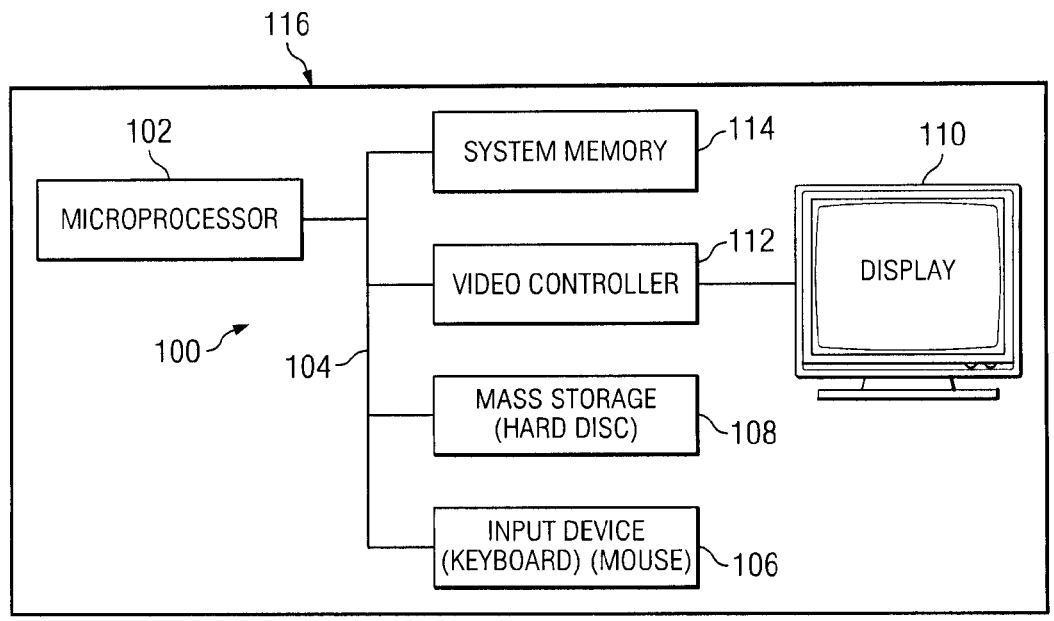
FIG. 1 is a schematic view illustrating an embodiment of an information handling system.

In one embodiment, information handling system 100, FIG. 1, includes a microprocessor 102, which is connected to a bus 104. Bus 104 serves as a connection between microprocessor 102 and other components of information handling system 100. An input device 106 is coupled to microprocessor 102 to provide input to microprocessor 102. Examples of input devices include keyboards, touchscreens, and pointing devices such as mouses, trackballs and trackpads. Programs and data are stored on a mass storage device 108, which is coupled to microprocessor 102. Mass storage devices include such devices as hard disks, optical disks, magneto-optical drives, floppy drives and the like. Information handling system 100 further includes a display 110, which is coupled to microprocessor 102 by a video controller 112. A system memory 114 is coupled to microprocessor 102 to provide the microprocessor with fast storage to facilitate execution of computer programs by microprocessor 102. In an embodiment, a chassis 116 houses some or all of the components of information handling system 100. It should be understood that other buses and intermediate circuits can be deployed between the components described above and microprocessor 102 to facilitate interconnection between the components and the microprocessor.

Figure 2A:
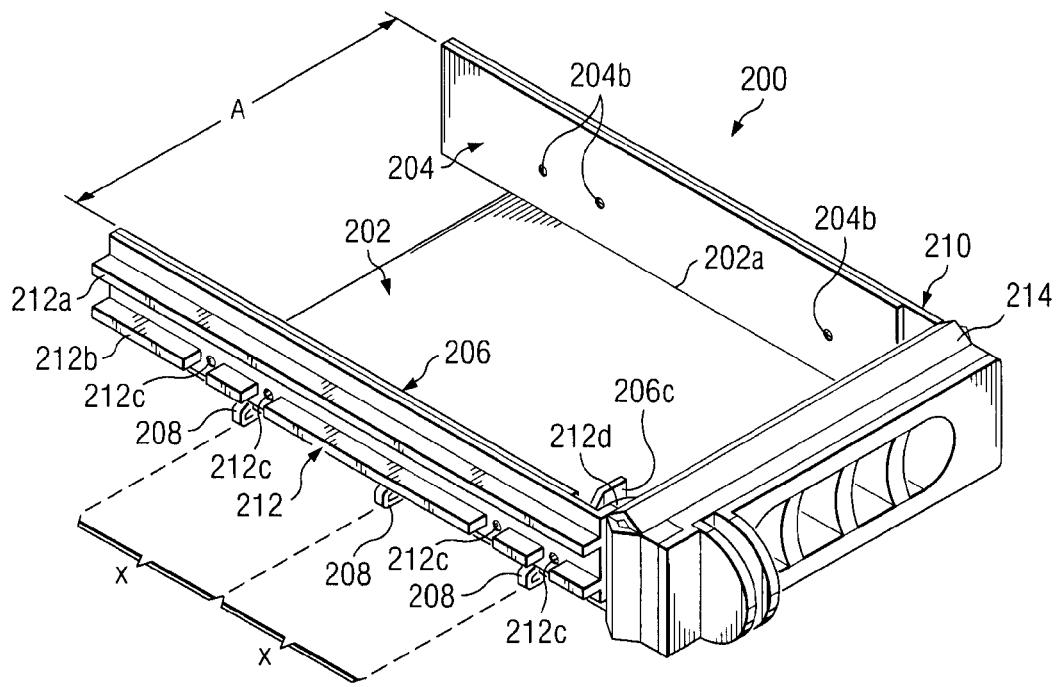
FIG. 2a is a front perspective view illustrating an embodiment of a component mounting apparatus.
Figure 2B:
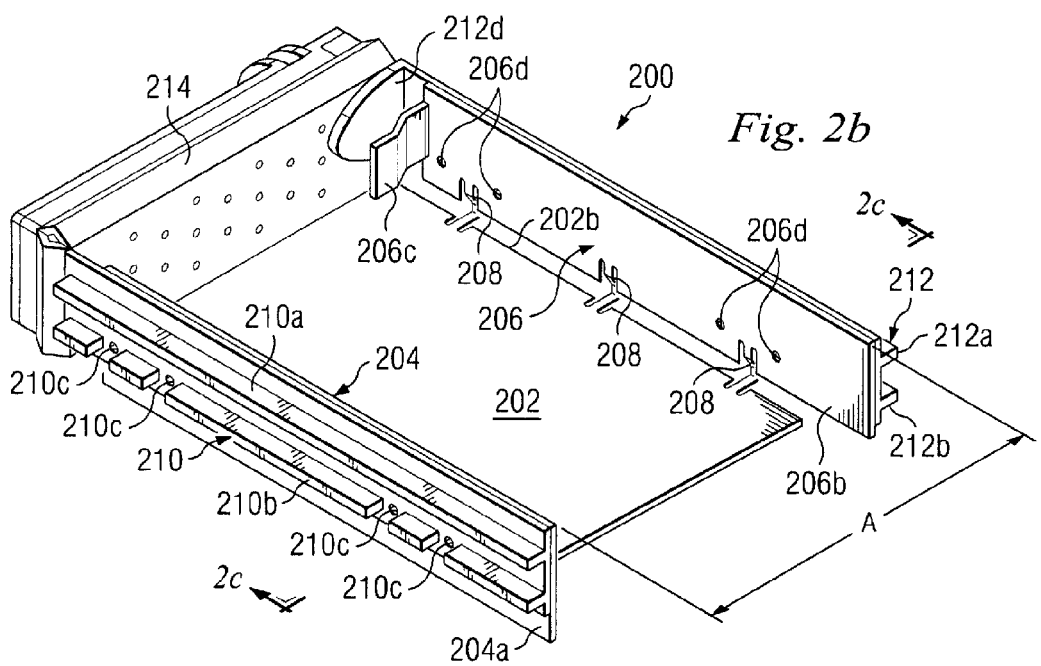
Figure 2C:
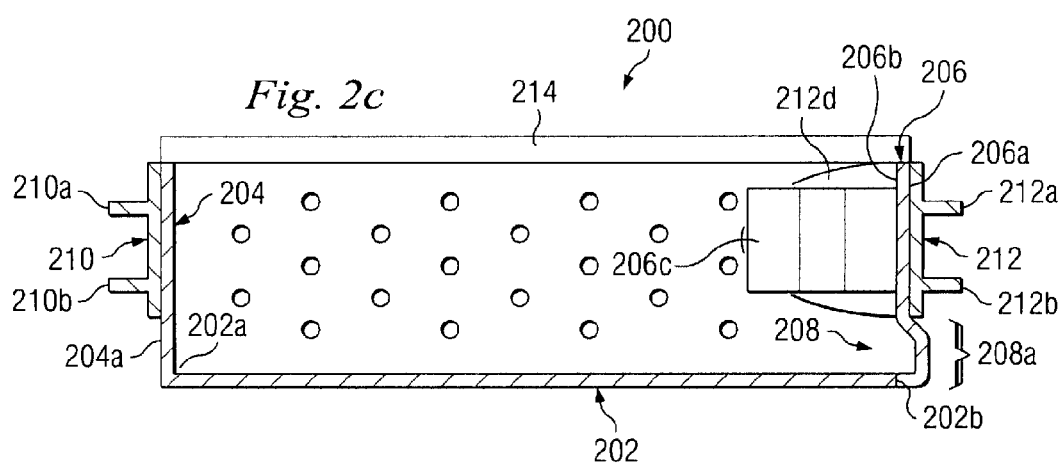
FIG. 2c is a cross sectional view illustrating an embodiment of the component mounting apparatus of FIG. 2b.

Referring now to FIGS. 2a, 2b, and 2c, a component mounting apparatus 200 is illustrated. The component mounting apparatus 200 includes a support surface 202 having a pair of opposing side edges 202a and 202b. A fixed wall 204 extends substantially perpendicularly from the side edge 202a of the support surface 202, includes an outer surface 204a, and defines a plurality of mounting apertures 204b in a spaced apart orientation along its length. A floating wall 206 is coupled to the side edge 202b of the support surface 202 by a plurality of resilient arms 208. Each resilient arm 208 is spaced apart from each other resilient arm 208 by some distance x, see FIG. 2a. The floating wall 206 includes an outer surface 206a, an inner surface 206b located opposite the outer surface 206a, a securing tab 206c extending from the inner surface 206b of the floating wall 206, and defines a plurality of securing apertures 206d in a spaced apart orientation along its length. Each of the plurality of resilient arms 208 extend from the side edge 202b of the support surface 202 and bend approximately ninety degrees before coupling to the floating wall 206. However, each of the plurality of resilient arms 208 also includes an arcuate section 208a as part of the ninety degree bend, as illustrated in FIG. 2c. The plurality of resilient arms 208 hold the floating wall 206 substantially parallel to the fixed wall 204 a distance A from each other. A chassis mounting member 210 is coupled to the outer surface 204a of the fixed wall 204, includes a plurality of substantially parallel and spaced apart rails 210a and 210b located along its length, and defines a plurality of mounting apertures 210c in a spaced apart orientation along its length. A chassis mounting member 212 is coupled to the outer surface 206a of the floating wall 206, includes a plurality of substantially parallel and spaced apart rails 212a and 212b located along its length, and defines a plurality of mounting apertures 212c in a spaced apart orientation along its length. The chassis mounting member 212 also includes an end 212d which is moveably mounted to a chassis mounting member front section 214 in order to allow movement of the floating wall 206. In an embodiment, the support surface 202, the fixed wall 204, the floating wall 206, and the plurality of resilient arms 208 are fabricated from a single piece of conventional sheet metal.

Referring now to FIG. 3, an average sized component 300 is illustrated. The average sized component 300 includes a base 302 having a front surface 302a, a rear surface 302b located opposite the front surface 302a, and a plurality of opposing side surfaces 302c and 302d extending between the front surface 302a and the rear surface 302b. The base 302 has a width $W_{AVG}$ which is defined as the distance between the side surfaces 302c and 302d. The base 302 defines a plurality of mounting apertures 304 in a spaced apart orientation along the length of the side surface 302c. A plurality of mounting apertures (not shown) which are substantially similar to the mounting apertures 304 are defined by the base 302 in a spaced apart orientation along the length of the side surface 302d. In an embodiment, the average sized component 300 is a conventional hard drive known in the art. In an embodiment, the average sized component 300 is a hot swap component known in the art. In an embodiment, the average sized component 300 is a conventional component having a size which is approximately the average size of similar type components known in the art.

Referring now to FIG. 4, an larger-than-average sized component 400 is illustrated. The larger-than-average sized component 400 includes a base 402 having a front surface 402a, a rear surface 402b located opposite the front surface 402a, and a plurality of opposing side surfaces 402c and 402d extending between the front surface 402a and the rear surface 402b. The base 402 has a width $W_{LRG}$ which is defined as the distance between the side surfaces 402c and 402d. The width $W_{LRG}$ is greater than the width $W_{AVG}$ of the average sized component 300, described above with reference to FIG. 3. The base 402 defines a plurality of mounting apertures 404 in a spaced apart orientation along the length of the side surface 402c. A plurality of mounting apertures (not shown) which are substantially similar to the mounting apertures 404 are defined by the base 402 in a space apart orientation along the length of the side surface 402d. In an embodiment, the larger-than-average sized component 400 is a conventional hard drive known in the art. In an embodiment, the larger-than-average sized component 400 is a hot swap component known in the art. In an embodiment, the larger-than-average sized component 400 is a conventional component having a size which is larger than the approximate average size of similar type components known in the art.

Referring now to FIG. 5, an smaller-than-average sized component 500 is illustrated. The smaller-than-average sized component 500 includes a base 502 having a front surface 502a, a rear surface 502b located opposite the front surface 502a, and a plurality of opposing side surfaces 502c and 502d extending between the front surface 502a and the rear surface 502b. The base 502 has a width $W_{SML}$ which is defined as the distance between the side surfaces 502c and 502d. The width $W_{SML}$ is smaller than the width $W_{AVG}$ of the average sized component 300, described above with reference to FIG. 3. The base 502 defines a plurality of mounting apertures 504 in a spaced apart orientation along the length of the side surface 502c. A plurality of mounting apertures (not shown) which are substantially similar to the mounting apertures 504 are defined by the base 502 in a spaced apart orientation along the length of the side surface 502d. In an embodiment, the smaller-than-average sized component 500 is a conventional hard drive known in the art. In an embodiment, the smaller-than-average sized component 500 is a hot swap component known in the art. In an embodiment, the smaller-than-average sized component 500 is a conventional component having a size which is smaller than the approximate average size of similar type components known in the art.

Figure 6:
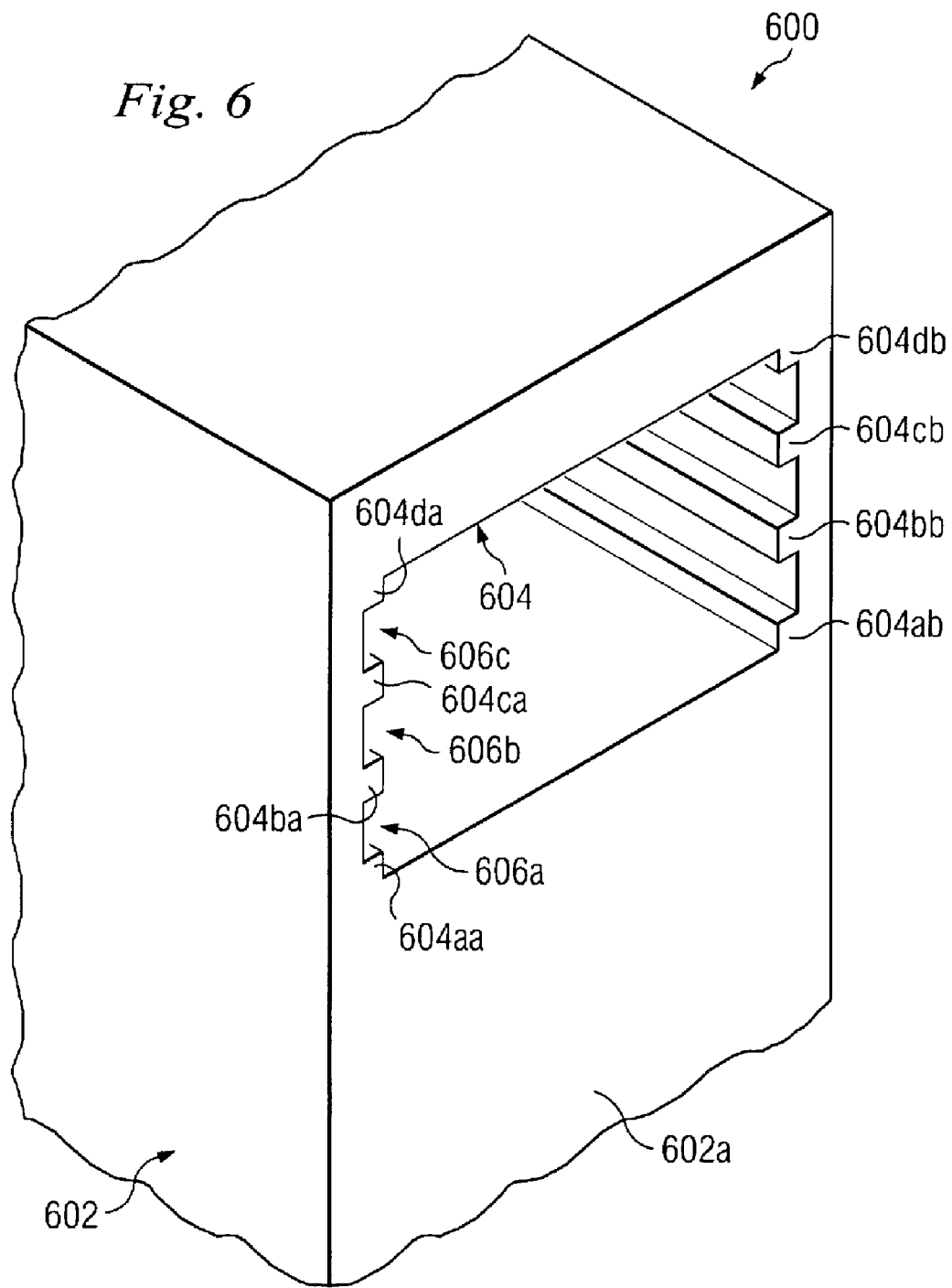
FIG. 6 is a perspective view illustrating an embodiment of a chassis used with the component mounting apparatus of FIGS. 2a, 2b, and 2c and the components of FIGS. 3, 4, and 5.

Referring now to FIG. 6, a chassis 600 is illustrated. The chassis 600 includes a base 602 having a front surface 602a. The base 602 defines a passageway 604 beginning on the front surface 602a and extending into the base 602. A plurality of supports 604aa, 604ab, 604ba, and 604bb extend from the base 602 into the passageway 604 and define a component slot 606a between them. A plurality of supports 604ca and 604cb extend from the base 602 into the passageway 604 and define a component slot 606b between themselves and the supports 604ba and 604bb. A plurality of supports 604da and 604db extend from the base 602 into the passageway 604 and define a component slot 606c between themselves and the supports 604ca and 604cb. In an embodiment, the chassis 600 may be the chassis 116, described above with reference to FIG. 1, and may house some or all of the components of the information handling system 100, described above with reference to FIG. 1.

Referring now to FIGS. 2a, 2b, 2c, 3, 7a, and 7b, a method 700 for mounting a component in a chassis is illustrated. The method 700 begins at step 702 where the component mounting apparatus 200, described above with reference to FIGS. 2a, 2b, and 2c, is provided. The method 700 then proceeds to step 704, where a component is positioned in the component mounting apparatus 200. The average sized component 300, described above with reference to FIG. 3, is positioned adjacent the component mounting apparatus 200 such that the front surface 302a of average sized component 300 is adjacent the chassis mounting member front section 214 on the chassis mounting apparatus 200, the side surface 302c of the average sized component 300 is adjacent the floating wall 206 on the chassis mounting apparatus 200, and the side surface 302d of the average sized component 300 is adjacent the fixed wall 204 on the chassis mounting apparatus 200, as illustrated in FIG. 7b. The average sized component 300 is then moved in a direction B such that the average sized component 300 is positioned on the support surface 202 between the fixed wall 204 and the floating wall 206 of the component mounting apparatus 200.

Referring now to FIGS. 7a, 7c, and 7d, the method 700 proceeds to step 706 where the average sized component 300 is secured in the component mounting apparatus 200. The width $W_{AVG}$ of the average sized component 300 is substantially equal to the distance A between the fixed wall 204 and the floating wall 206 on the component mounting apparatus 200, so the average sized component 300 may be positioned on the support surface 202 and between the fixed wall 204 and the floating wall 206 without substantially deflecting the resilient arms 208 or the floating wall 206, as illustrated in FIG. 7d. A plurality of securing devices such as, for example, the threaded fasteners 706a, may secure the average sized component 300 to the component mounting apparatus 200 by positioning them in the mounting apertures provided on the component mounting apparatus 200 such as, for example, the mounting apertures 210c, 212c, 204b, 206d and the mounting apertures provided on the average sized component 300 such as, for example, the mounting apertures 304.

Figure 7E:
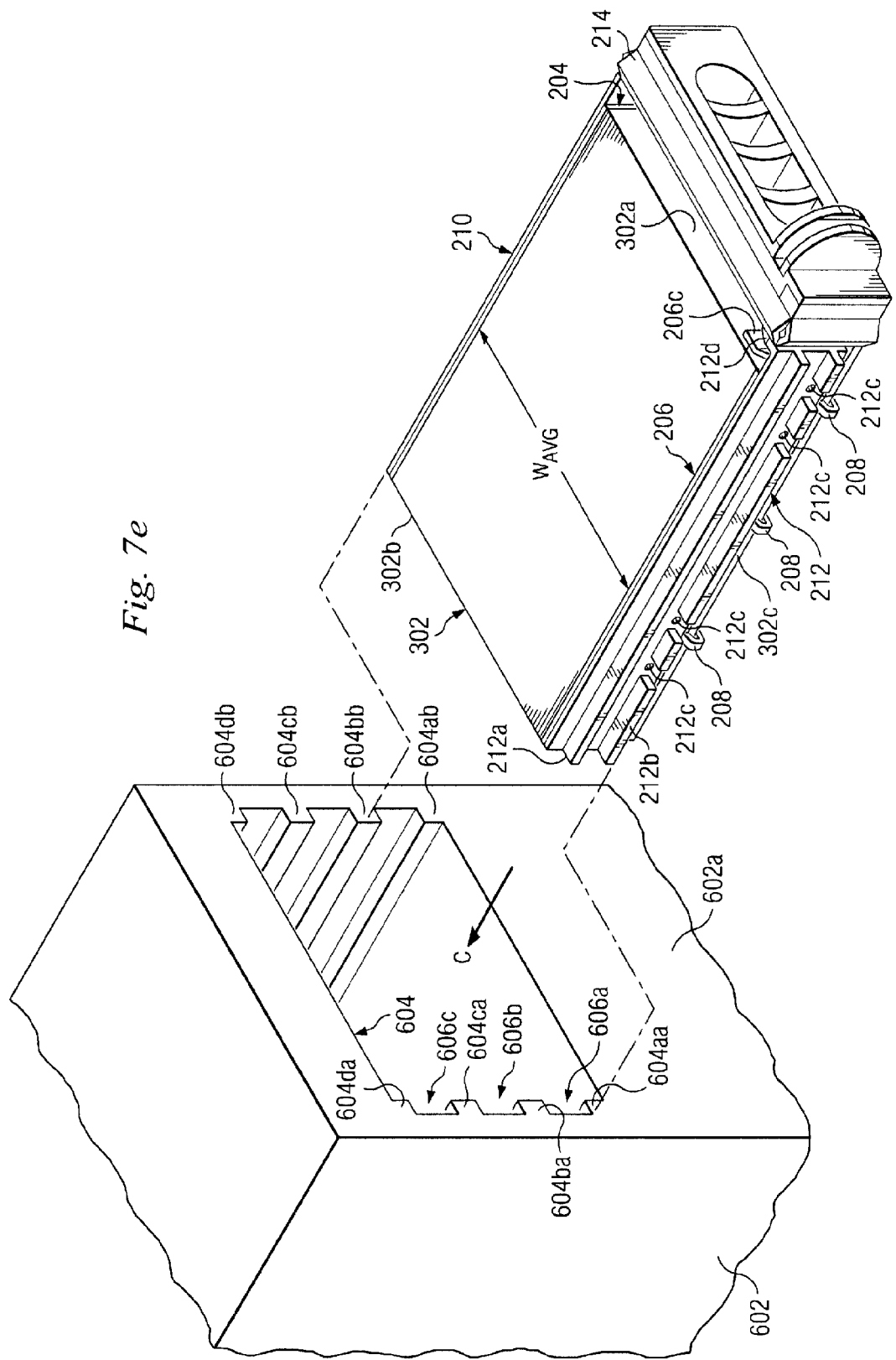
FIG. 7e is a perspective view illustrating an embodiment of the component and the component mounting apparatus of FIG. 7c being mounted in the chassis of FIG. 6.

Referring now to FIGS. 6, 7a, and 7e, the method 700 proceeds to step 708 where the chassis 600, described above with reference to FIG. 6, is provided. The method 700 then proceeds to step 710 where the average sized component 300 is mounted to the chassis 600 using the component mounting apparatus 200. The component mounting apparatus 200 with the average sized component 300 is positioned adjacent the component slot 606a in the passageway 604 defined by the chassis 600 such that the rear surface 302b of the average sized component 300 is immediately adjacent the component slot 606a, as illustrated in FIG. 7e. The component mounting apparatus 200 may then be moved in a direction C such that the rails 210a and 210b and the rails 212a and 212b on component mounting members 210 and 212, respectively engage the supports 604bb, 604ab, and 604ba, 604aa, respectively, which mounts the average sized component 300 in the chassis 600. In an embodiment, a plurality of additional components may be mounted to the chassis 600 in the chassis slots 606b and 606c in a substantially similar manner as described above for the average sized component 300. In an embodiment, with the average sized component 300 mounted in the chassis 600, the average sized component 300 is coupled to an information handling system component which is housed in the chassis 600 such as, for example, the microprocessor 102, described above with reference to FIG. 1.

Referring now to FIGS. 2a, 2b, 2c, 4, 8a, and 8b, a method 800 for mounting a component in a chassis is illustrated. The method 800 begins at step 802 where the component mounting apparatus 200, described above with reference to FIGS. 2a, 2b, and 2c, is provided. The method 800 then proceeds to step 804, where a component is positioned in the component mounting apparatus 200. The larger-than-average sized component 400, described above with reference to FIG. 4, is positioned adjacent the component mounting apparatus 200 such that the front surface 402a of larger-than-average sized component 400 is adjacent the chassis mounting member front section 214 on the chassis mounting apparatus 200, the side surface 402c of the larger-than-average sized component 400 is adjacent the floating wall 206 on the chassis mounting apparatus 200, and the side surface 402d of the larger-than-average sized component 400 is adjacent the fixed wall 204 on the chassis mounting apparatus 200, as illustrated in FIG. 8b. The larger-than-average sized component 400 is then moved in a direction D such that the larger-than-average sized component 400 is positioned on the support surface 202 between the fixed wall 204 and the floating wall 206 of the component mounting apparatus 200.

Referring now to FIGS. 8a, 8c, and 8d, the method 800 proceeds to step 806 where the larger-than-average sized component 400 is secured in the component mounting apparatus 200. The width $W_{LRG}$ of the larger-than-average sized component 400 is larger than the distance A between the fixed wall 204 and the floating wall 206 on the component mounting apparatus 200, so the positioning of the larger-than-average sized component 400 on the support surface 202 and between the fixed wall 204 and the floating wall 206 results in the deflection of the plurality of resilient arms 208 to adjust the position of the floating wall 206 such that the distance between the floating wall 206 and the fixed wall 204 is approximately equal to the width $W_{LRG}$ of the larger-than-average sized component 400, as illustrated in FIG. 8d. A plurality of securing devices such as, for example, the threaded fasteners 806a, may secure the larger-than-average sized component 400 to the component mounting apparatus 200 by positioning them in the mounting apertures provided on the component mounting apparatus 200 such as, for example, the mounting apertures 210c, 212c, 204b, 206d and the mounting apertures provided on the larger-than-average sized component 400 such as, for example, the mounting apertures 404. The arcuate section 208a on the plurality of resilient arms 208 allows the floating wall 206 to move such that the larger-than-average sized component 400 does not become stuck in the component mounting apparatus 200 or cause the support surface 202 to bow towards the larger-than-average sized component 400 such that the side walls bow away from the larger-than-average sized component 400, as is typical in a conventional component mounting apparatus, and can make the threaded fasteners 806a difficult to install.

The method 800 then proceeds to step 808 and 810 where the chassis 600 is provided and the larger-than-average sized component 400 may be mounted to the chassis 600 using the component mounting apparatus 200 in substantially the same manner as described above for the average sized component 300 and the chassis 600 illustrated in FIG. 7e.

Referring now to FIGS. 2a, 2b, 2c, 5, 9a, and 9b, a method 900 for mounting a component in a chassis is illustrated. The method 900 begins at step 902 where the component mounting apparatus 200, described above with reference to FIGS. 2a, 2b, and 2c, is provided. The method 900 then proceeds to step 904, where a component is positioned in the component mounting apparatus 200. The smaller-than-average sized component 500, described above with reference to FIG. 5, is positioned adjacent the component mounting apparatus 200 such that the front surface 502a of smaller-than-average sized component 500 is adjacent the chassis mounting member front section 214 on the chassis mounting apparatus 200, the side surface 502c of the smaller-than-average sized component 500 is adjacent the floating wall 206 on the chassis mounting apparatus 200, and the side surface 502d of the smaller-than-average sized component 500 is adjacent the fixed wall 204 on the chassis mounting apparatus 200, as illustrated in FIG. 9b. The smaller-than-average sized component 500 is then moved in a direction E such that the smaller-than-average sized component 500 is positioned on the support surface 202 between the fixed wall 204 and the floating wall 206 of the component mounting apparatus 200.

Referring now to FIGS. 9a, 9c, and 9d, the method 900 proceeds to step 906 where the smaller-than-average sized component 500 is secured in the component mounting apparatus 200. The width $W_{SML}$ of the smaller-than-average sized component 500 is smaller than the distance A between the fixed wall 204 and the floating wall 206 on the component mounting apparatus 200, so the positioning of the smaller-than-average sized component 500 on the support surface 202 and between the fixed wall 204 and the floating wall 206 results in empty space between the side surfaces 502c and 502d and fixed wall 204 and the floating wall 206, respectively. A plurality of securing devices such as, for example, the threaded fasteners 906a, may secure the smaller-than-average sized component 500 to the component mounting apparatus 200 by positioning them in the mounting apertures provided on the component mounting apparatus 200 such as, for example, the mounting apertures 210c, 212c, 204b, 206d and the mounting apertures provided on the smaller-than-average sized component 500 such as, for example, the mounting apertures 504. During the securing of the smaller than average sized component 500 to the component mounting apparatus 200, the arcuate section 208a on the plurality of resilient arms 208 allows the floating wall 206 to move such that the fixed wall 204 and the floating wall 206 may be secured to the smaller-than-average sized component 500 without causing the support surface 202 to bow away from the smaller-than-average sized component 500, as is typical in a conventional component mounting apparatus, and results in the support surface 202 taking up more volume in a chassis than is desired.

The method 900 then proceeds to step 908 and 910 where the chassis 600 is provided and the smaller-than-average sized component 500 is mounted to the chassis 600 using the component mounting apparatus 200 in substantially the same manner as described above for the average sized component 300 and the chassis 600, illustrated in FIG. 7e.

Thus, a component mounting apparatus 200 and methods 700, 800 and 900 are provided which allow a plurality of different sized components 300, 400, and 500 to be secured in the component mounting apparatus 200 and mounted to a chassis 600. The component mounting apparatus 200 provides a simple and economically fabricated mechanism to adjust the dimensions of the component mounting apparatus 200 in order to allow the different sized components 300, 400, and 500 to be easily secured in or be removed from the component mounting apparatus 200.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A component mounting apparatus, comprising
a support surface comprising a first side edge and a second side edge located opposite the first side edge;
a first wall having a first flexibility relative to the support surface and extending from the first side edge of the support surface; and
a second wall having a second flexibility relative to the support surface, more flexible than the first flexibility, and coupled to the support surface by a plurality of resilient arms that extend between the second side edge of the support surface and the second wall such that the second wall is spaced apart from the support surface by the resilient arms, and each resilient arm being spaced apart from each other resilient arm, wherein the support surface, the first wall, the second wall, and the plurality of resilient arms are each a portion of a single, continuous piece of material.

2. The apparatus of claim 1, wherein the single, continuous piece of material is a single, continuous piece of sheet metal that has been stamped and bent to form the support surface, the first wall, the second wall, and the plurality of resilient arms.

3. The apparatus of claim 1, wherein the plurality of resilient arms hold the second wall in a substantially parallel and spaced apart orientation with respect to the first wall.

4. The apparatus of claim 1, wherein each of the plurality of resilient arms comprise an approximately ninety degree bend.

5. The apparatus of claim 1, wherein each of the plurality of resilient arms comprise an arcuate section operable to adjust the distance between the second wall and the first wall.

6. The apparatus of claim 1, further comprising:
a component positioned on the support surface and between the first wall and the second wall.

7. The apparatus of claim 6, wherein the component is a smaller than average sized component which is coupled to the first wall and the second wall, whereby the plurality of resilient arms adjust the position of the second wall such that the distance between the first wall and the second wall is approximately equal to the width of the smaller than average sized component.

8. The apparatus of claim 6, wherein the component is a larger than average sized component which is coupled to the first wall and the second wall, whereby the plurality of resilient arms adjust the position of the second wall such that the distance between the first wall and the second wall is approximately equal to the width of the larger than average sized component.

9. An information handling system, comprising:
a chassis defining a component slot, wherein a support extends from the chassis on each of a pair of opposing sides of the component slot;
a microprocessor coupled to the chassis; and
a component mounting apparatus positioned in the component slot, the component mounting apparatus comprising:
a support surface comprising a first side edge and a second side edge located opposite the first side edge;
a first wall having a first flexibility relative to the support surface and extending from the first side edge of the support surface;
a second wall having a second flexibility relative to the support surface, more flexible than first flexibility, and coupled to the support surface by a plurality of resilient arms that extend between the second side edge of the support surface and the second wall such that the second wall is spaced apart from the support surface by the resilient arms, each resilient arm being spaced apart from each other resilient arm;
a chassis mounting member extending from each of the first wall and the second wall, wherein the chassis mounting members engage the supports; and
a component positioned on the support surface between the first wall and the second wall and coupled to the microprocessor.

10. The system of claim 9, wherein the support surface, the first wall, the second wall, and the plurality of resilient arms are each a portion of a single, continuous piece of material.

11. The system of claim 9, wherein the plurality of resilient arms hold the second wall in a substantially parallel and spaced apart orientation with respect to the first wall.

12. The system of claim 9, wherein each of the plurality of resilient arms comprise an approximately ninety degree bend.

13. The system of claim 9, wherein each of the plurality of resilient arms comprise an arcuate section operable to adjust the distance between the second wall and the first wall.

14. The system of claim 9, wherein the component is a smaller than average sized component which is coupled to the first wall and the second wall, whereby the plurality of resilient arms adjust the position of the second wall such that the distance between the first wall and the second wall is approximately equal to the width of the smaller than average sized component.

15. The system of claim 9, wherein the component is a larger than average sized component which is coupled to the first wall and the second wall, whereby the plurality of resilient arms adjust the position of the second wall such that the distance between the first wall and the second wall is approximately equal to the width of the larger than average sized component.

16. A method for mounting a component in a chassis, comprising:
providing a component mounting apparatus comprising a support surface having a first side edge and a second side edge located opposite the first side edge, a first wall having a first flexibility relative to the support surface and extending from the first side edge of the support surface, a second wall having a second flexibility relative to the support surface, more flexible than the first flexibility, and coupled to the support surface by a plurality of resilient arms that extend between the second side edge of the support surface and the second wall such that the second wall is spaced apart from the support surface by the resilient arms, each resilient arm being spaced apart from each other resilient arm, and a chassis mounting member extending from each of the first wall and the second wall;
positioning a component in the component mounting apparatus on the support surface and between the first wall and the second wall; and
securing the component to the component mounting apparatus.

17. The method of claim 16, further comprising:
providing a chassis defining a component slot and comprising a support extending from the chassis on each of a pair of opposing sides of the component slot; and
mounting the component in the chassis by positioning the component mounting apparatus in the component slot and engaging the chassis mounting members with the supports.

18. The method of claim 16, wherein the securing comprises securing a smaller than average sized component to the component mounting apparatus, whereby the plurality of resilient arms adjust the position of the second wall such that the distance between the second wall and the first wall is approximately equal to a width of the smaller than average component.

19. The method of claim 16, wherein the securing comprises securing a larger than average sized component to the component mounting apparatus, whereby the plurality of resilient arms adjust the position of the second wall such that the distance between the second wall and the first wall is approximately equal to a width of the larger than average component.

* * * * *